(12) United States Patent
Vallade et al.

(10) Patent No.: US 12,165,847 B2
(45) Date of Patent: Dec. 10, 2024

(54) TREATMENT UNIT FOR A FACILITY FOR TREATING THE SURFACE OF A SUBSTRATE IN MOTION, CORRESPONDING FACILITY AND METHOD OF IMPLEMENTATION

(71) Applicant: COATING PLASMA INNOVATION, Fuveau (FR)

(72) Inventors: Julien Vallade, Trets (FR); Cédric Pfister, Rousset (FR)

(73) Assignee: Coating Plasma Innovation, Fuveau (FR)

(*) Notice: Subject to any disclaimer, the term of this patent is extended or adjusted under 35 U.S.C. 154(b) by 572 days.

(21) Appl. No.: 16/345,105

(22) PCT Filed: Nov. 2, 2017

(86) PCT No.: PCT/FR2017/053005
§ 371 (c)(1),
(2) Date: Apr. 25, 2019

(87) PCT Pub. No.: WO2018/091797
PCT Pub. Date: May 24, 2018

(65) Prior Publication Data
US 2019/0287767 A1    Sep. 19, 2019

(30) Foreign Application Priority Data
Nov. 16, 2016 (FR) ...................... 1661074

(51) Int. Cl.
*H01J 37/32* (2006.01)
*C23C 16/455* (2006.01)
(Continued)

(52) U.S. Cl.
CPC .. *H01J 37/32449* (2013.01); *C23C 16/45517* (2013.01); *C23C 16/45574* (2013.01);
(Continued)

(58) Field of Classification Search
CPC ............. H01J 37/32449; H01J 37/3277; H01J 37/32532; H01J 37/32825;
(Continued)

(56) References Cited

U.S. PATENT DOCUMENTS

2003/0113479 A1* 6/2003 Fukuda ............. H01J 37/32825
427/569
2004/0187783 A1 9/2004 Maeda et al.
(Continued)

FOREIGN PATENT DOCUMENTS

JP      2016/062812      4/2016
WO   WO 2016/128259 A1   8/2016

OTHER PUBLICATIONS

International Search Report mailed Feb. 6, 2018 from corresponding International Application No. PCT/FR2017/053005.
(Continued)

*Primary Examiner* — Parviz Hassanzadeh
*Assistant Examiner* — Nathan K Ford
(74) *Attorney, Agent, or Firm* — Jordan IP Law, LLC; Todd A. Vaughn

(57) ABSTRACT

This unit comprises a housing (50) for receiving an electrode suitable for creating an electrical discharge, and first means (20, 21, 22) for injecting treatment gas, comprising at least one plasma-forming gas, towards the support of the facility. According to the invention, the first injection means comprise an intake member (20) for the treatment gas, a treatment gas injection member (21), opening opposite the support, and an intermediate chamber (22) connecting these two members. This chamber comprises an upstream region (24), the gas passage cross-section of which increases from the inlet (25E, 26E) towards the outlet (25S, 26S) in longitudinal view (XX) and/or transverse view, as well as a downstream region (27), the passage cross-section of which
(Continued)

increases from the inlet (28E, 29E) towards the outlet (28S, 29S) in transverse view but decreases in the vicinity of the outlet (28S, 29S) in longitudinal view (XX). Due to the shape of the chamber and to the changes in direction of the gas in this chamber, the invention confers, in particular, a homogeneous distribution of treatment gas over the entire treatment width of the substrate.

14 Claims, 5 Drawing Sheets

(51) Int. Cl.
*C23C 16/50* (2006.01)
*C23C 16/54* (2006.01)

(52) U.S. Cl.
CPC ........ *C23C 16/45578* (2013.01); *C23C 16/50* (2013.01); *C23C 16/545* (2013.01); *H01J 37/3244* (2013.01); *H01J 37/32761* (2013.01); *H01J 37/3277* (2013.01); *H01J 37/32899* (2013.01)

(58) Field of Classification Search
CPC ........ C23C 16/45517; C23C 16/45574; C23C 16/45595; C23C 16/45582; C23C 16/545
USPC ........................................ 118/718
See application file for complete search history.

(56) References Cited

U.S. PATENT DOCUMENTS

| | | | |
|---|---|---|---|
| 2005/0001527 A1* | 1/2005 | Sugiyama | H01J 37/32082 313/231.31 |
| 2005/0106094 A1* | 5/2005 | Kondo | C01B 32/159 423/447.2 |
| 2009/0165715 A1 | 7/2009 | Oh | |
| 2011/0244140 A1 | 10/2011 | Takano | |

OTHER PUBLICATIONS

French Search Report mailed Mar. 22, 2017 from corresponding French Application No. 1661074.

* cited by examiner

TREATMENT UNIT FOR A FACILITY FOR TREATING THE SURFACE OF A SUBSTRATE IN MOTION, CORRESPONDING FACILITY AND METHOD OF IMPLEMENTATION

This application is a U.S. national phase application of International Application No. PCT/FR2017/053005, filed Nov. 2, 2017, which claims priority to French Application No. 1661074 Nov. 16, 2016, the disclosures of which are all hereby incorporated by reference herein.

TECHNICAL FIELD OF THE INVENTION

The invention relates to a treatment unit intended to equip a facility for the surface treatment of a moving substrate. It relates more precisely to such a facility in which the substrate is subjected to a plasma generated in a gaseous mixture, which leads to the modification of the surface state of the substrate and/or to the formation of a deposit on the aforementioned surface. The invention relates in particular to such a facility, which can be used at a pressure close to atmospheric pressure, and which is suitable for the continuous surface treatment of polymer films in rolls (a method of the "roll-to-roll" type).

PRIOR ART

Facilities are already known, aimed at modifying and improving the surface properties of a substrate by means of a plasma. Such properties of interest may for example be the surface energy or the adhesion properties of this substrate. The substrates to which the invention relates may in particular be insulators such as polymer films, metal films, paper or fabric.

In the use of these known facilities, with a view to the deposition of a thin solid layer on the surface of a substrate, this surface is subjected to a plasma created by an electrical discharge in a gas. Moreover, simultaneously or subsequently, the substrate thus treated is exposed to a gaseous mixture that contains an active gaseous compound, able to cause the deposition of this thin solid film.

Continuously implementing methods for the treatment of a substrate by means of an electrical discharge in a gaseous mixture is also known, wherein the substrate is moved at speeds that may range up to several hundreds of meters per minute, particularly in a chamber. The latter, apart from the electrodes necessary for creating the discharge, contains a device for injecting the active gaseous mixture, as well as means for discharging gaseous effluents.

The invention relates more particularly to a plasma treatment facility operating substantially at atmospheric pressure. In this type of facility, the circulation of the gases in the plasma zone is critical for obtaining satisfactory homogeneity of treatment. This homogeneity of treatment is in particular critical across the width of the substrate, namely along the direction perpendicular to the direction of travel of this substrate.

A treatment facility such as the one that the invention relates to comprises first of all means for injecting a plasma-forming gas, optionally associated with an auxiliary gas such as a dopant. The prior art involves injection means of varied natures and forms, such as tubes pierced with holes or slots. Such a facility further comprises at least one electrode intended to cooperate with a counter-electrode in order to generate an electrical discharge. In the case where a plurality of electrodes are provided, they are disposed successively in the direction of travel of the substrate.

In order to concentrate the dopants in the vicinity of each electrode, WO-A-2016/128259 describes a treatment head equipped with injection tubes pierced with holes, as well as a plurality of electrodes. The plasma-forming gas is injected at the rear of the electrodes, whereas doping gases are injected in the vicinity of the surface of the substrate. This configuration effectively affords an improvement compared with the solution involving a common injection of plasma-forming gas and dopants behind the electrodes. On the other hand, the space between the injection and the electrode gives rise to turbulences and zones where the gases are recirculated. Consequently the dopants have a tendency to redisperse in the volume of the aforementioned head, instead of being concentrated between the electrode and the substrate. In addition, in the case of a plasma deposition, such recirculations promote the formation of powders. Moreover, when the power is increased, the plasma extends as far as the vertical edges of the electrode, which causes a loss of efficiency. This is because, at this specific point, the plasma cannot serve to treat the substrate.

In the installation described in JP-A-2016/062812, the plasma-forming gas is injected by means of a slot, while one of the walls of the injection is formed by an insulating plate on which an electrode is placed. This configuration makes it possible to reduce, to a certain extent, the turbulences and the phenomena of recirculation of the gases. On the other hand, in particular in the case of a flexible substrate travelling over a support roller, it is found that the plasma treatment implemented by means of this facility is difficult to control.

US 2005/001527 describes a plasma treatment apparatus in which the treatment gas is admitted at the top part and then flows along an intermediate chamber in a direction perpendicular to the travel of the substrate, before being injected in the direction of this substrate. This apparatus is equipped with mutually adjacent electrodes, between which a dielectric material is inserted.

Having regard to the above, one objective of the present invention is to at least partially remedy the drawbacks of the prior art mentioned above.

Another objective of the invention is to propose a treatment unit that enables the facility that is equipped therewith to provide good homogeneity of treatment across the width of the substrate, namely perpendicular to the direction of travel of this substrate.

Another objective of the invention is to propose such a unit the geometry of which makes it possible to concentrate any dopants in the vicinity of the surface of the travelling substrate.

Another objective of the invention is to propose such a unit, making it possible to maximize the effect of the plasma treatment in order to be able to treat the flexible substrates at high speed.

Another objective of the invention is to propose such a unit which, while providing reliable surface treatment of a substrate, in particular of the "roll-to-roll" type, at a pressure close to atmospheric pressure, makes it possible to significantly reduce the quantity of dopant gases consumed compared with the prior art.

Another objective of the invention is to propose such a unit which confers on the facility that is equipped therewith convenient control and relatively simple implementation.

OBJECTS OF THE INVENTION

According to the invention, at least one of the above objectives is achieved by means of a treatment unit (1A) for a facility for the surface treatment of a substrate (SUB) in motion, this installation further comprising
- a support (2) for the substrate,
- a counter-electrode, in particular coincident with the support;
- this treatment unit comprising
- at least one housing (50) for receiving at least one electrode suitable for cooperating with said counter-electrode in order to create an electrical discharge;
- first injection means (20, 21, 22) for injecting a first gas, or treatment gas, towards said support, this first gas comprising at least one plasma-forming gas;
- characterized in that the first injection means comprise
- a member (20) for admission of the first gas, intended to be put in communication with a source supplying this first gas, this admission member having a principal axis (A20) defining a first direction of flow of the gas,
- a member (21) for injecting the first gas, emerging opposite the support,
- an intermediate chamber (22) connecting these two respective admission and injection members,
- this intermediate chamber comprising
- an upstream region (24) extending from the admission member (20), the first gas flowing in service in a second direction in this upstream region, said second direction being oblique, in particular perpendicular, with respect to said first direction, the cross section of passage of the first gas increasing from the inlet (25E, 26E) towards the outlet (25S, 26S) of the upstream region in longitudinal view along axis XX and/or in transverse view along axis YY,
- and a downstream region (27) extending between the upstream region (24) and the injection member (21), the first gas flowing in service in a third direction in this downstream region, said third direction being oblique, in particular perpendicular, with respect to said second direction, the cross section of passage of the first gas increasing from the inlet (28E, 29E) towards the outlet (28S, 29S) of the downstream region in transverse view along axis YY, but the cross section of passage of the first gas decreasing in the vicinity of the outlet (28S, 29S) of the downstream region in longitudinal view along axis XX.

A plasma treatment installation comprises one or more treatment units according to the invention, as well as a support roll on which the substrate to be treated is pressed. The or each unit provides the injection of the gases, as well as the generation of the plasma. The substrate passes between the support roll and each unit, with a view to treatment thereof.

In accordance with the invention, providing an intermediate chamber as defined above is particularly advantageous. In service, the treatment gas flows first of all in the admission member before entering the intermediate chamber, which fulfils this homogenization function. In this chamber, the principal direction of this gas undergoes a plurality of changes. Moreover, the cross section of passage of this gas undergoes variations, including in particular an increase in transverse view. Consequently this confers in particular a homogeneous distribution in a transverse dimension, namely over the entire treatment width of the substrate.

It should be noted first of all that the intermediate homogenization chamber according to the invention provides performances appreciably superior to those of the device described in JP-A-2016/062812. This is because this document makes provision for interposing a chamber having a particularly simple shape, roughly parallelepipedal, situated between an inlet pipe and an outlet slot. Under these conditions, the homogenization of the distribution is certainly better than in the case of direct injection, not having recourse to such a chamber. On the other hand, differences between the outlet speeds of the gas persist between the center and the ends of the aforementioned slot, since the shapes of this chamber cause unwanted recirculations of the gas.

It should also be noted that US 2005/001527 is silent with regard to any variation in the cross section of passage of the downstream region in transverse view. Moreover, in this document, the downstream portion has a constant cross section so that this cross section does not decrease in the vicinity of the outlet thereof. Finally, the direction of flow of the gas is roughly invariant, namely vertical, all along the intermediate chamber described in this document.

According to the invention, at least one of the above objectives is also achieved by means of a treatment unit (1A) for a facility for the surface treatment of a substrate (SUB) in motion, this installation further comprising
- a support (2) for the substrate,
- a counter-electrode, in particular coincident with the support;
- this treatment unit comprising
- at least one housing (50) for receiving at least one electrode suitable for cooperating with said counter-electrode in order to create an electrical discharge;
- first injection means (20, 21, 22) for injecting a first gas, or treatment gas, towards said support, this first gas comprising at least one plasma-forming gas; these first injection means comprising a member (21) for injecting the first gas, emerging opposite the support,
- second injection means (30, 31, 32) for injecting a second gas, or auxiliary gas, towards said support, these second injection means comprising a member (31) for injecting the second gas, emerging opposite the support,
- the member (31) injecting the second gas being inclined in the direction of the member (21) injecting the first gas, in longitudinal view.

According to other features of the invention:
- the intermediate chamber is symmetrical with respect to the median axis (A1) of the unit (1A), in transverse view along axis YY, the upstream region (24) being formed by two upstream conduits (25, 26) extending on either side of said median axis, the downstream region (27) being formed by two downstream conduits (28, 29) extending on either side of said median axis and each extending a respective upstream conduit,
- the intermediate chamber (22) is formed around a central core (23) having an upstream face (231) turned towards the admission member (20), and lateral faces (232) extending from the upstream face (231), the central core being in particular triangular in shape,
- the injection member (21) extends over substantially the entire width of the unit, being in particular formed by a single slot,
- this unit further comprises second injection means (30, 31, 32) for injecting a second gas towards said support, these second injection means comprising a member (31) for injecting the second gas, emerging opposite the support, the member for injecting the second gas being inclined in the direction of the member (21) injecting the first gas, in longitudinal view,
- the second injection means (30, 31, 32) further comprise a member (30) for admitting the second gas, intended to be put in communication with a source supplying this second gas, as well as an intermediate chamber (32) connecting the two respective admission and injection members, this intermediate chamber comprising an upstream region (36) extending from the admission member (30), the first gas flowing in service in a second direction in this upstream region, said second direction being oblique, in particular, with respect to said first direction, the cross section of passage of the first gas increasing from the inlet (36E) towards the outlet (36S) of the upstream region in longitudinal view and/or in transverse view, and a downstream region (39) extending between the upstream region (26) and the injection member (31), the first gas flowing in service in a third direction in this downstream region, said third direction being oblique, in particular perpendicular, with respect to said second direction, the cross section of passage of the first gas increasing from the inlet (39E) towards the outlet (39S) of the downstream region, in transverse view, but the cross section of passage of the first gas decreasing in the vicinity of the outlet (39S) of the downstream region, in longitudinal view, the principal axes, respectively of the member injecting the first gas and of the member injecting the second gas, form an angle ($\alpha 31$) of between 20° and 70°, in particular between 40° and 50°, especially around 45°, the outlets, respectively of the member injecting the first gas and of the member injecting the second gas, are separated by a distance (d3) of less than 10 millimeters, in particular less than 4 millimeters, the outlets, respectively of the housing and of the member injecting the second gas, are separated by a distance (d2) of less than 20 millimeters, in particular less than 15 millimeters, the unit comprises bottom edges, respectively upstream and downstream, that are rounded in shape, the radius of curvature of which is between 0.5 millimeters and 10 millimeters, the electrode is received in a tight fit in its housing, this electrode and these walls comprising edges with a rounded shape, the radius of curvature of which is between 0.5 millimeters and 10 millimeters, in longitudinal view along axis XX, the admission member (20) is placed in front, or downstream, with respect to the injection member (21), with reference to the travel of the substrate in service, this unit is produced in the form of a solid block, the bottom wall of which, facing the support, is substantially solid, the distance (d1) between this bottom wall and the support being substantially constant in the longitudinal direction, this distance being in particular less than 5 millimeters, especially less than 2 millimeters, the unit comprises a plurality of distinct constituent elements, in particular machined, these elements being mutually connected together by permanent fixing means, in particular by adhesive bonding or welding, the unit comprises a single constituent element, this unit having no assembly joints, this unit being in particular produced by rapid prototyping, stereolithography or three-dimensional printing.

These additional features may be implemented with one or other of the aforementioned main objects, individually or in any technically compatible combinations.

Another subject matter of the invention is a facility for the surface treatment of a substrate (SUB) in motion, comprising a support for the substrate, a counter-electrode, in particular coincident with the support;

a treatment assembly placed downstream of the pressing roll, with reference to the travel of the substrate, said assembly comprising at least one treatment unit as defined above;

at least one source of treatment gas and optionally at least one source of auxiliary gas, able to supply the first injection means and optionally the second injection means of each treatment unit.

Advantageously, said assembly comprises a plurality of treatment units, these units being put in communication with at least two different sources of treatment gas and/or two different sources of auxiliary gases.

According to other features of the invention:

these several treatment units are disposed one behind the other, in the direction of travel of the substrate, these several treatment units are disposed alongside each other, in the direction of travel of the substrate, the treatment units disposed alongside each other are equipped with mutual fixing means, in particular removable fixing means, for example of the tenon and mortise type.

Another subject matter of the invention is a method for using a surface treatment facility as defined above, in which the substrate is moved, treatment gas is injected in the direction of this substrate, and auxiliary gas is injected in the direction of this substrate, so as to press at least part of this auxiliary gas in the vicinity of this substrate.

Advantageously, the first gas is caused to flow at the outlet of the injection member at a speed of between 1 m/s and 20 m/s, in particular at the same speed as the speed of travel of the substrate.

DESCRIPTION OF THE FIGURES

The invention will be described below with reference to the accompanying drawings given solely by way of non-limitative examples, wherein.

The following numerical references are used in the present description:

| | |
|---|---|
| 1A-1D Blocks | 2 Drum |
| f2 Rotation of 2 | D2 Diameter of 2 |
| L2 Length of 2 | SUB Substrate |

-continued

| | |
|---|---|
| S1 S2 Movement of SUB | f3 Rotation of 3 |
| 3 Nip (pressing roll) | L3 Length of 3 |
| D3 Diameter of 3 | 12 13 Upstream downstream |
| 11 16 Top bottom walls of 1 | walls of 1 |
| 14 15 Lateral walls of 1 | d1 Distance 16-2 |
| 17, 17' Edges of 1 | |
| 20 Admission member | 21 Injection member |
| d20 Distance 20-21 | A21 Axis of 21 |
| 22 Chamber | 23 Central core |
| 231 Upstream face of 23 | 232 Lateral faces of 23 |
| 24 Upstream region of 22 | 25, 26 Conduits of 24 |
| 25E, 26E Inlets of 25, 26 | 25S, 26S Outlets of 25, 26 |
| 27 Downstream region of 2 | 28, 29 Conduits of 27 |
| 28E, 29E Inlets of 28, 29 | 28E, 29E Outlets of 28, 29 |
| 30 Admission member | 31 Injection member |
| A31 Axis of 31 | α31 Angle A21 A31 |
| 32 Chamber | 36 Upstream conduit of 32 |
| 36E, 36S Inlet outlet of 36 | 39 Downstream conduit of 32 |
| 39E, 39S Inlet outlet of 39 | |
| 50 Housing | 50' Edges of 50 |
| d2 Distance 31-50 | d3 Distance 21-31 |
| 4 Containment cover | 41 Top wall of 4 |
| 42 43 Upstream downstream walls of 4 | 44 45 Lateral walls of 4 |
| 120 Admission member | 121 Injection member |
| 130 Admission member | 131 Injection member |
| 104 Confinement cover | V103 Internal volume of 103 |
| α31 Angle A21 A31 | |
| 1a-1n Treatment units (FIG. 6) | 14a-14n, 50a-15n Lateral walls |
| 18a-18n Tenons | 19a-19n Mortises |
| 20a-20n Admission members | |

DETAILED DESCRIPTION

Figure 1:
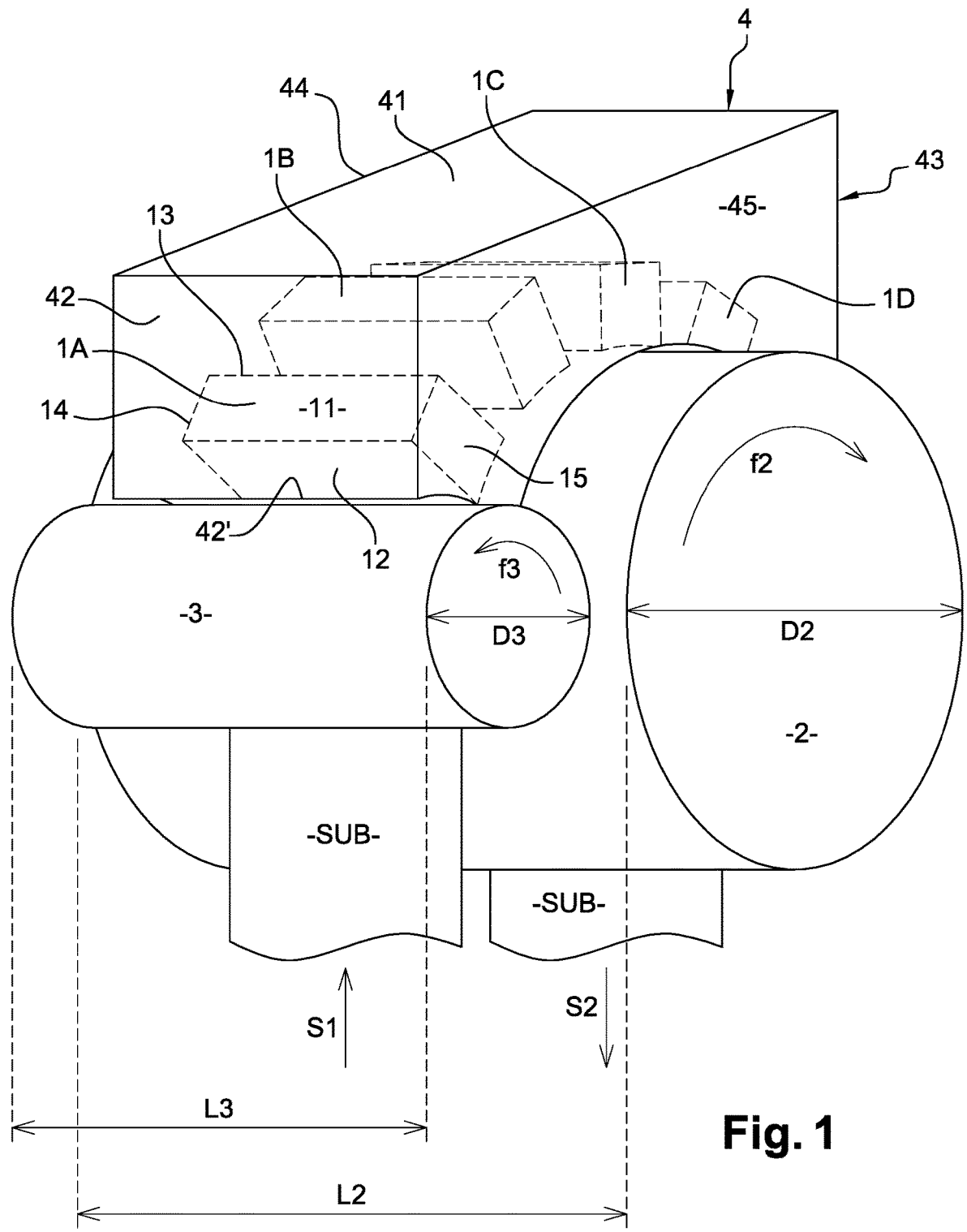
FIG. 1 is a perspective view illustrating a surface treatment facility equipped with treatment units according to the invention.
Figure 2:
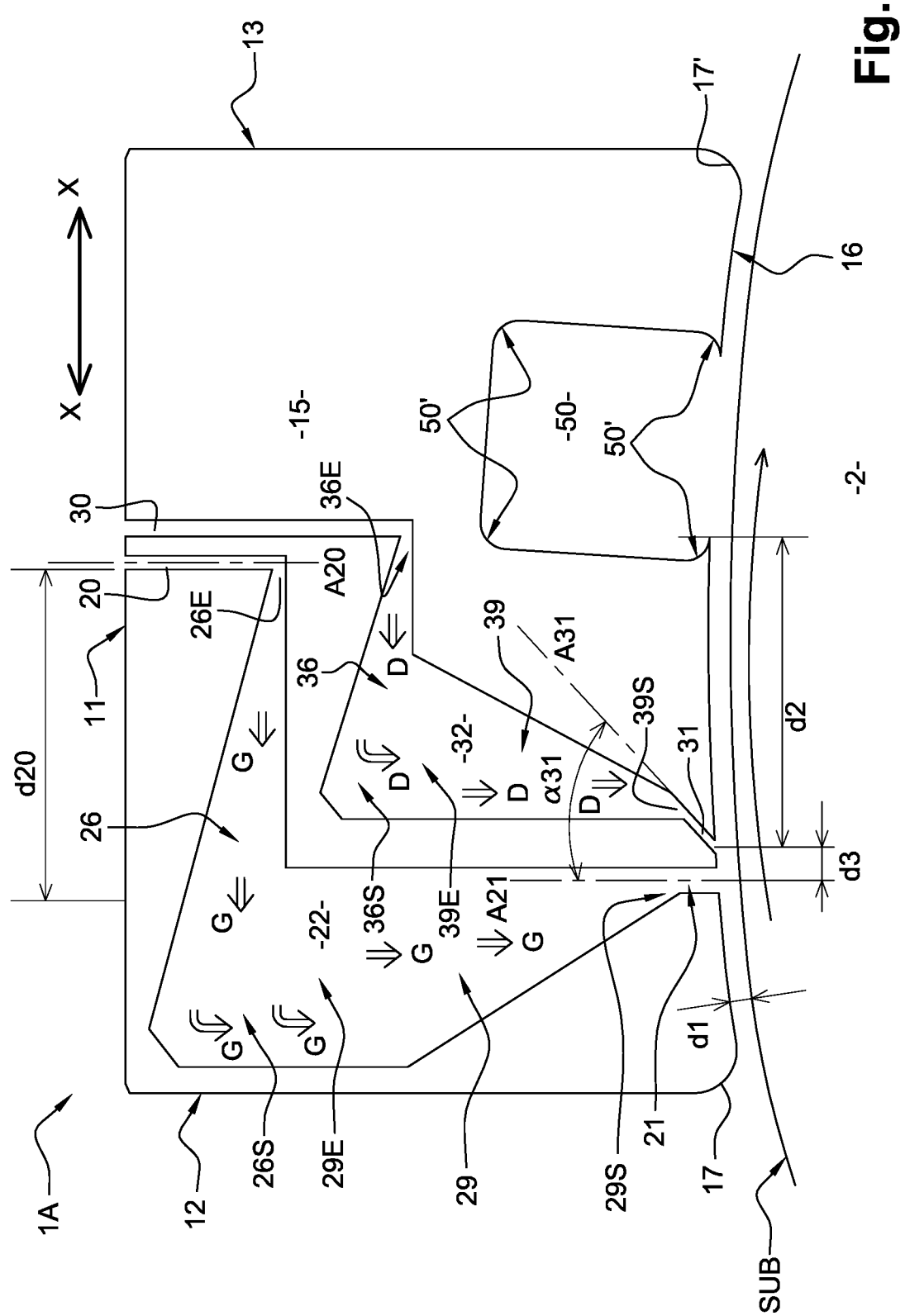
FIG. 2 is a front view illustrating, to a much larger scale, one of these treatment units according to the invention.

FIG. 1 illustrates a plasma surface treatment facility equipped with a treatment assembly formed by a plurality of treatment units 1A to 1D according to the invention, which are shown in more detail in FIG. 2 et seq. This facility comprises essentially, apart from the aforementioned units, a drum 2 forming a support for a substrate SUB, a pressing roll 3 and a containment cover 4 covering these blocks.

The drum 2, of a type known per se, is rotated in service in the direction represented by the arrow f2. Its diameter is denoted D2 and its longitudinal dimension L2. Thus drum forms a support for the substrate SUB, intended to travel in the direction of the arrows S1 and S2, so as to be treated in accordance with the invention. Hereinafter, the longitudinal direction corresponds to the direction of travel of the substrate, whereas the transverse or lateral direction is perpendicular to this direction of travel. Moreover, by convention, a front view, also referred to as the longitudinal view, designates a view in which the longitudinal direction is included in the plane of the sheet, as in FIGS. 2 and 5. A side view, also referred to as a transverse view, designates a view in which the longitudinal direction extends from rear to front of the sheet, as in FIG. 3.

In the present embodiment, the drum 2 fulfils an additional function of counter-electrode, which cooperates with electrodes that will be described hereinafter. For this purpose, this drum is advantageously covered with an insulating layer, in a manner known per se. However, this counter-electrode may be formed by another component of the facility. By way of example, the substrate is made from polypropylene, while the thickness thereof is between 20 and 100 micrometers.

In its upstream part, with reference to the movement of the substrate, the drum 2 is advantageously associated with the pressing roll 3 (also referred to as "nip" by persons skilled in the art), also of a type known per se. As will be described in more detail hereinafter, the secondary roll 3 is rotated in service in the direction represented by the arrow f3. This presses the substrate against the drum, so as to avoid the formation of a layer of air between this substrate and drum. This prevents any local treatment defect on the substrate. Its diameter is denoted D3, which is much less than the diameter D2 of the drum, and its longitudinal direction is denoted L3, which is for example similar to the longitudinal dimension L2 of the drum.

The various treatment units, which are advantageously identical, are produced in the form of solid blocks 1A to 1D. The structure of one 1A of these blocks will now be described, knowing that the structure of the other blocks is similar.

The block 1A has a top wall 11 and peripheral walls, formed by parallel walls respectively front or upstream 12 and rear or downstream 13, as well as parallel lateral walls 14 and 15. By way of example its first dimension, defined by the distance between the walls 14 and 15, is typically between 1000 mm and 2000 mm, it being understood that it may have appreciably lower values, for example 20 mm. By way of example its second dimension, defined by the distance between the walls 12 and 13, is between 50 mm and 200 mm. Each block is fixed by any suitable means, preferably removably, to the lateral walls of the cover 4, which will be described below.

This block 1A also has a bottom wall 16 turned towards the drum 2. This wall 16, which is substantially solid, delimits the outlet for the first and second injection means, respectively for a first and second gas. It is furthermore hollowed out with a housing, with a view to receiving at least one electrode. These injection means, as well as this housing and electrode, will now be described in more detail.

This bottom wall 16 is separated from the drum 2 by a distance denoted d1, which is advantageously constant in the longitudinal direction of travel. For this purpose, this bottom wall has a radius of curvature R16 that is equal to R16=R2+d1, where R2 is the radius of the drum, that is to say D2/2, and d1 is the aforementioned distance. In the case where the substrate travels over a flat support, such as a plate, the bottom of the block is also flat and extends parallel to the opposite face of the support. This distance d1 is preferably less than 5 millimeters, in particular less than 2 millimeters, especially around 1 millimeter.

Providing a constant distance (d1) avoids any substantial recirculation of the treatment gases in the space provided between the block and the surface of the substrate. This feature also remedies, to a significant extent, the drawbacks relating to JP-A-2016/062812 presented above. This is because, according to the teaching of this document, the space between the insulating plate and the substrate varies and consequently the power density of the plasma varies according to the position. The plasma treatment implemented by means of the present invention is therefore substantially easier to control than in the facility of JP-A-2016/062812.

The junction between the upstream wall 12 and the bottom wall 16 of the block defines a first edge, referred to as the upstream edge 17. In a similar fashion, the junction between the downstream wall 13 and the bottom wall 16 defines a second edge referred to as the downstream edge 17'. Advantageously, these edges 17 and 17' are rounded, with a radius of curvature typically lying between 0.5 mm (millimeters) and 10 mm. This rounded shape among other things prevents recirculations of gas.

The first injection means comprise essentially an admission member 20, an injection member 21 and an intermediate chamber 22. Each of these members 20 and 21 has a substantially constant cross section of passage, between its upstream and downstream ends. Advantageously, the cross section of passage of the gas in the injection member is greater than the cross section of passage in the admission member. The total cross section of admission is for example between 0.07 and 1.2 cm$^2$, whereas the total cross section of injection is for example between 0.3 and 2 cm$^2$. The ratio between the total injection cross section and the total admission cross section is therefore for example between 1.5 and 10.

In longitudinal view along the axis XX, the admission member 20 is placed in front, or downstream, with respect to the injection member 21, with reference to the travel of the substrate in service. Let R20 be the radius of the circle passing through the center of the drum 2 and the admission member, the distance between these two members 20 and 21, in a straight line perpendicular to R20, is denoted D20. This distance is for example between 0 mm and 150 mm. This offset between the two members 20 and 21 increases the volume of the chamber 22 in order to have better homogenization.

Figure 4:
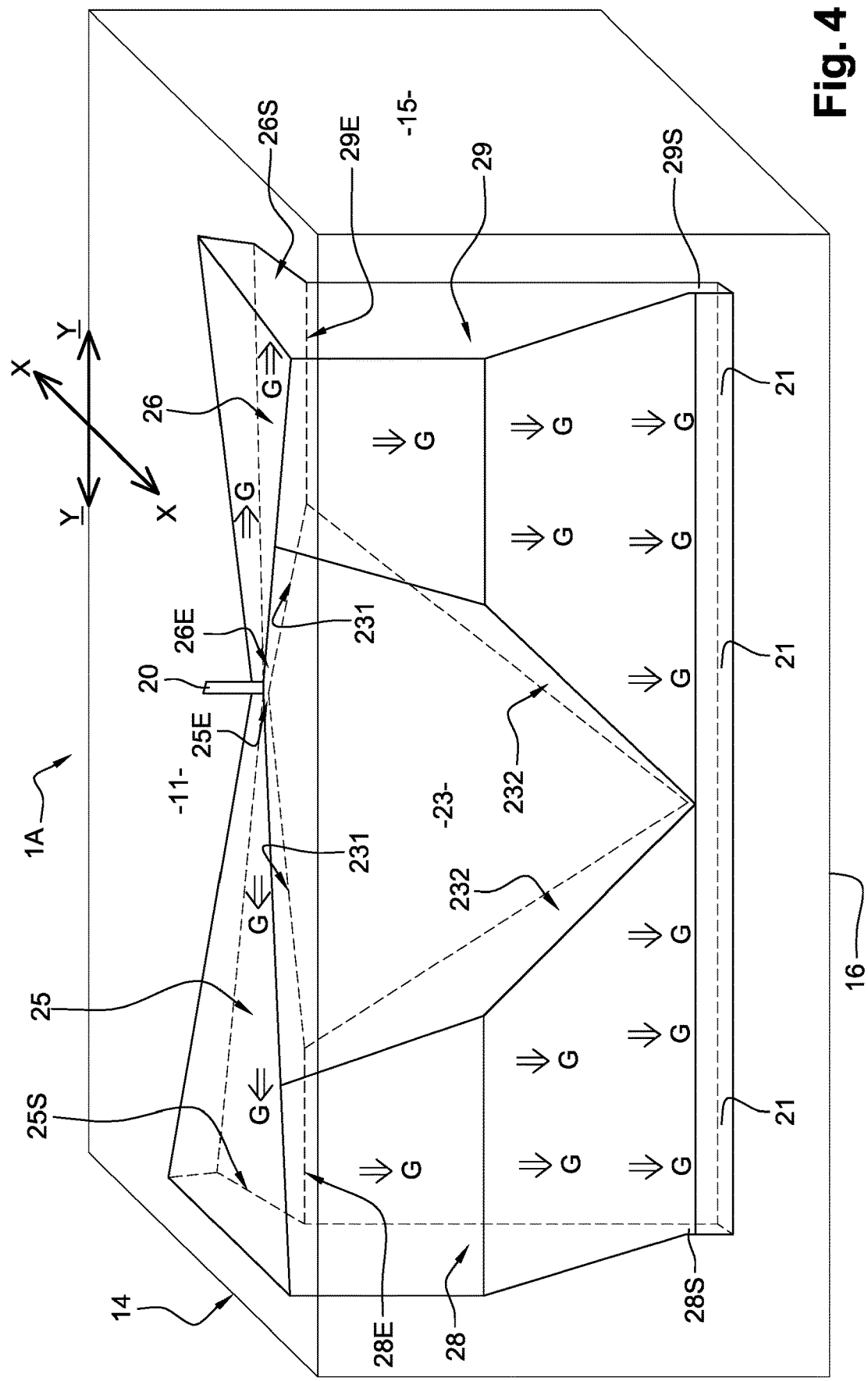
FIG. 4 is a perspective view illustrating the homogenization chamber of FIG. 3.

Typically, as shown on the perspective in FIG. 4, the admission member may take the form of a single tubular passage 20, short in length. In the case of a very wide block, it is possible to provide some tubular admission passages regularly distributed. Moreover, the injection member 21 may take the form of a series of short tubular passages, distributed linearly or in a zigzag between the walls 14 and 15. Preferably, this injection member 21 is formed by a single slot, extending transversely between the aforementioned walls 14 and 15.

The upstream outlet of the admission member 20 is put in communication with a source supplying a first gas, the nature of which will be detailed below, while the downstream outlet of the injection member 21 is placed facing the substrate. The principal axis A21 of the injection member 21 is radial, with reference to the drum 2. In other words, this axis extends substantially perpendicular to the travelling substrate.

Figure 3:
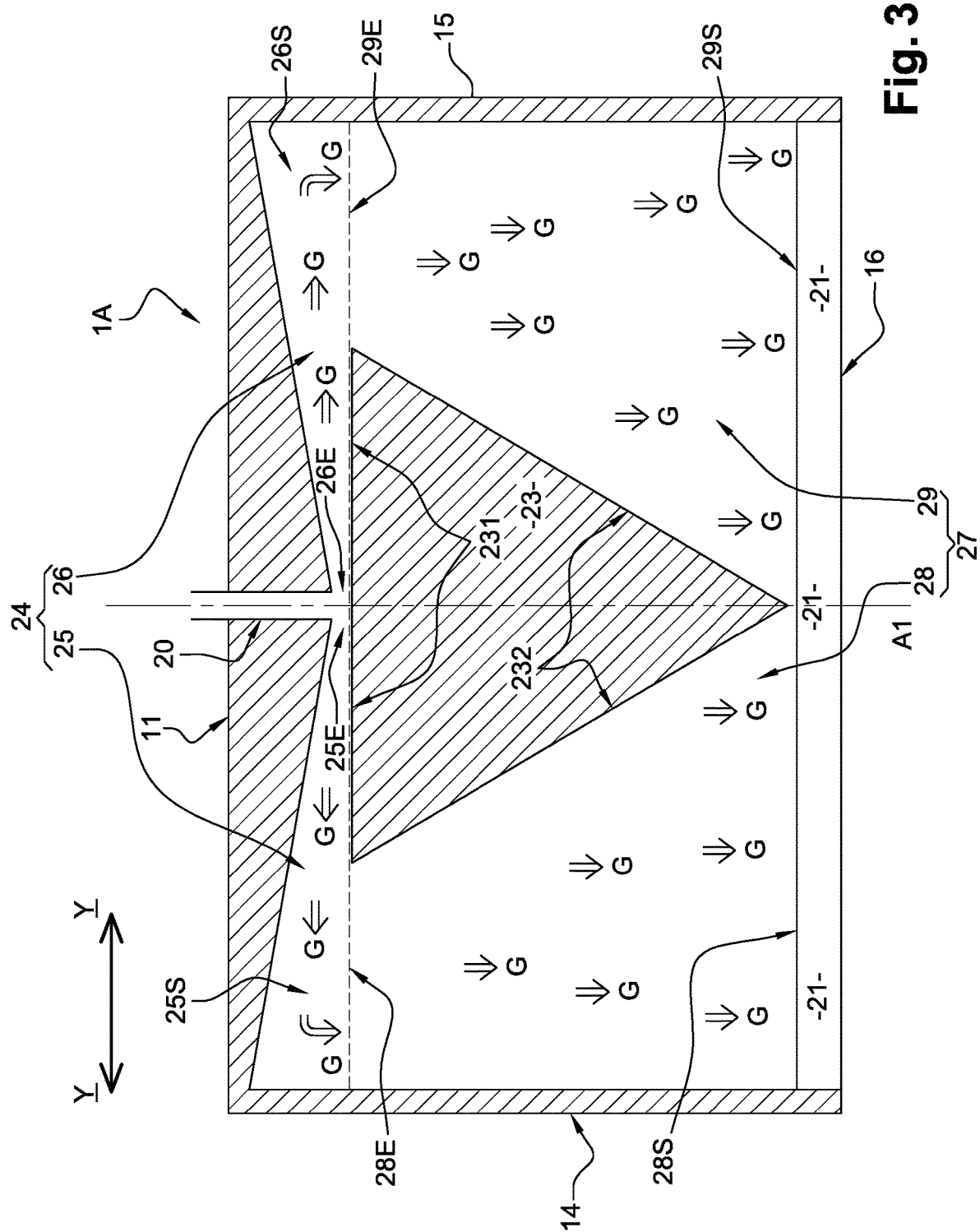
FIG. 3 is a view in cross section, illustrating more particularly the homogenization chamber with which the treatment unit of FIG. 2 is equipped.

As shown in particular by FIGS. 3 and 4, the intermediate chamber 22 is formed around a central core 23, produced in the form of a solid shell. Consequently, the gas cannot enter the shell, so that it is forced to flow along it, as will be detailed below. This core has, in cross section in FIG. 3, a roughly triangular shape. It has a so-called upstream face 231, horizontal in the figures, which is turned towards the inlet conduit, as well as lateral faces 232 extending from the upstream face.

As shown by the transverse view in FIG. 3, the intermediate chamber 22 is symmetrical with respect to a median axis A1 of the block. This chamber comprises first of all an upstream region 24, extending from the inlet passage 20. This region is formed by two conduits 25 and 26 extending roughly tangentially with reference to the support 2, namely horizontally in the figures. The inlets 25E and 26E of these conduits extend the passage 20, whereas the outlets 25S and 26S emerge in the downstream region 27, which will be described below.

In service the first gas flows first of all in a first direction, which corresponds to the principal axis A20 of the passage 20, that is to say substantially vertically. Then this gas progresses substantially horizontally in these conduits 25 and 26, namely in a second direction that is roughly perpendicular to the first direction mentioned above. Moreover, the cross section of passage of the first gas increases from the inlet towards the outlet of each conduit of this upstream region. This increase in cross section is found both in longitudinal view (that is to say along the axis XX visible in FIGS. 2 and 4) and in transverse view (that is to say along the axis YY visible in FIGS. 3 and 4). By way of variant, provision can be made for this cross section of passage to increase solely in one of the two axes XX or YY, it being understood that an increase in both these directions at the same time is particularly advantageous.

The intermediate chamber 22 further comprises a downstream region 27, extending from the upstream region 24 described above. This region is formed by two conduits 28 and 29 extending roughly radially with reference to the support 2, namely vertically in the figures. The inlets 28E and 29E of these conduits extend the upstream conduits 25 and 26, whereas the outlets 28S and 29S emerge in the injection slot 21.

In service, at the outlet of the upstream region, the first gas is returned, in particular at a roughly right angle, in the direction of the downstream region of the chamber. This gas then flows substantially vertically in the conduits 28 and 29, namely in a third direction that is roughly perpendicular to the first direction mentioned above. The progression of the gas in the intermediate chamber is, in these figures, represented by the successive arrows G.

Moreover, in transverse view along the axis YY, namely in FIG. 3, the cross section of passage of the first gas increases from the inlet 28E or 29E towards the outlet 28S or 29S of each conduit 28 or 29 of this downstream region. On the other hand, in longitudinal view along the axis XX, namely in FIG. 2, the cross section of passage of the first gas decreases in the vicinity of the outlet 28S or 29S of each conduit 28 or 29 of this downstream region. This reduction in cross section corresponds to the junction between each downstream conduit 28, 29 and the injection slot 21.

Without wishing to be bound by the theory, it may be considered that the first gas is admitted in the passage 20 while having a cylindrically shaped flow. Then it is introduced into the chamber 22, where it undergoes expansion so as to lose this cylindrical shape. This gas is next pushed progressively towards the injection slot 21, so that it emerges from the unit 1 in the form of a sheet of gas.

The second injection means have a structure similar to that of the first injection means, described above. Consequently the mechanical elements of these second means, which are similar to those of the first means, are allocated the same reference numbers increased by 10.

These second injection means comprise essentially an inlet member 30, an injection member 31 and an intermediate chamber 32. Each of these members 30 and 31 has a substantially constant cross section of passage, between its upstream and downstream ends. Advantageously, the cross section of passage of the gas in the injection member is greater than the cross section of passage in the inlet member. The total inlet cross section is for example between 0.07 and 1.2 cm$^2$, whereas the total injection cross section is for example between 0.3 and 2 cm$^2$. The upstream outlet of the member 30 is put in communication with a source supplying a second gas, the nature of which will be detailed below, whereas the downstream outlet of the injection member 31 is placed opposite the substrate.

According to a particularly advantageous feature of the invention, the principal axis A31 of the injection member 31 is inclined with respect to a radius of the drum 2, in the upstream direction with reference to the travel of the substrate. In other words, this injection member 31 extends obliquely, while being turned towards the injection member 21 for the first gas. The angle formed with the axes A21 and A31 is denoted α31, which is between 20° and 70°, preferentially between 40° and 50°, particularly around 45°. In addition the distance d3 between the outlets of the injection members 21 and 31 is advantageously less than 10 mm, preferably less than 4 mm. This distance d3 is calculated between the respective centers of these outlets. Providing such a geometry is advantageous, as will be described hereinafter.

The intermediate chamber 32 has roughly the same structure and the same function as the chamber 22 described above. However, the shapes and dimensions of this chamber 32 may vary, compared with those of the chamber 22, in particular in order to adapt to the overall size of the treatment unit 1A. The intermediate chamber 32 is formed around a central core, similar to the central core 23 above, which however is not shown in the figures.

This chamber 32 comprises first of all an upstream region, extending from the inlet passage 30. This region is formed by two conduits, only one of which 36 is visible in FIG. 2. The inlets (of which only 36E is shown in FIG. 2) of each conduit extend the passage 30. Moreover, the outlets (only one of which 36S is shown in FIG. 2) of each upstream conduit emerge in a downstream region, formed by two conduits, one of which 39 is visible in FIG. 2. The inlets (only one of which 39E is shown in FIG. 2) of each downstream conduit extend the conduits, whereas the outlets (only one of which 39S is shown in FIG. 2) emerge in the injection slot 31.

The block 1A is also hollowed out with at least one housing 50, each of which is intended for receiving a corresponding electrode, not shown. In the example illustrated, there is a single housing, it being understood that it is possible to provide a plurality of housings disposed one behind the other, in the direction of travel of the substrate. This housing 50 advantageously emerges on at least one of the lateral walls of the block, namely towards the front and/or the rear of the sheet in FIG. 3. This affords easy accessibility to this housing for the user, so that the latter can directly fit the electrode in the housing that is dedicated thereto.

The electrode, which is for example elongate like a bar, has a square cross section. Advantageously, this electrode has rounded edges, which cooperate in a tight fit with rounded edges 50' provided on the walls of the housing 50. The radius of curvature of these rounded edges is for example between 0.5 mm and 10 mm. Advantageously, the edges of the electrode are not metalized, so as to prevent the transfer of the plasma in the vicinity of these edges. Consequently a concentration of the plasma is advantageously found between the electrode and the substrate.

Preferably, the distance between the facing walls of the electrode and the substrate is substantially constant, being substantially equal to the above value d1. Use is advantageously made of electrodes in the form of a flat bar, with a small width. Consequently the variations in the distance between this electrode and the substrate are negligible. This feature makes it possible to avoid any threshold or discontinuity in the space between the electrode and the substrate, so as to prevent any significant recirculation of gas. Under these conditions, a substantially laminar flow of this gas is ensured.

Moreover, the smallest distance d2 separating the respective outlets, belonging to the conduit 31 and the housing 50, is advantageously less than 20 mm and preferably less than 15 mm. This makes it possible to preserve a maximum concentration of the auxiliary gas, in particular of the dopants contained in the latter, in the vicinity of the surface of the substrate.

Advantageously, each electrode has a small external surface, which prevents the creation of turbulence in the plasma formation zone. This electrode is preferably produced from ceramic material, which makes it possible to treat an electrically conductive substrate. Alternatively, the electrodes may be produced in any other suitable material, such as a metal material. This electrode is connected to a power source, not shown.

Means, not shown, of any suitable type, are provided so as to hold the electrode in position in its housing. Advantageously, each electrode is in particular fixed removably, for example by snapping on. Consequently, a given electrode may be replaced by another similar electrode, in particular in the case of failure. This electrode may also be replaced by another electrode of a different type. The expression "different electrodes" means that at least one of the following parameters varies from one tube to another:

Total dimension of the electrode.
Material of the electrode.
Form of the electrode.

Each block is produced from an insulating material, such as a polymer, a composite, wood or ceramic. Preferentially, the material constituting the block is a composite reinforced with ceramic powder, which makes it possible to combine ease of machining with thermal resistance and mechanical strength. The form of each chamber 22 and 32, which can be defined by digital modeling, is then integrated in the production of the block.

In a first variant, the block is formed from several constituent elements, which are then adhesively bonded or welded to each other. In this case, the chambers may be machined. By way of advantageous variant, the block is formed from a single constituent element. In this case, the chambers are produced simultaneously by methods such as rapid prototyping, stereolithography or three-dimensional printing, also referred to as "3D printing". These manufacturing methods make it possible to avoid the presence of joints of glue or assembly joints on the unit, in particular inside these injection chambers.

The treatment facility in FIG. 1 further comprises a so-called containment cover 4, making it possible to confer a controlled treatment atmosphere. In cross section this cover 4 is in the form of a U with splayed wings. It comprises a top wall or web 41, two front walls or wings 42 and 43, and two side walls 44 and 45 visible in FIG. 1. With reference to the direction of rotation of the drum, the wing 42 is referred to as the upstream wing whereas the wing 43 is referred to as the downstream wing.

Advantageously, certain characteristic dimensions are chosen in a perfectly defined range of values:
- the smallest distance d'1 between the end edge of the upstream wall 42 of the cover 4 and the pressing roll 3 is chosen less than 15 millimeters, preferably less than 5 millimeters;
- the smallest distance between the upstream wall 42 of the cover 4 and the treatment unit is chosen less than 20 millimeters, preferably less than 2 millimeters. This distance separates the aforementioned wall 42 with respect to the top edge of the block 1A;
- the smallest distance between the upstream end of the treatment unit and the support is chosen less than 5 millimeters, preferably less than 2 millimeters;
- the smallest distance between a first treatment block, such as the block 1A, and the following treatment block, such as the block 1B, is chosen between d'1 and 10 mm, preferably between d'1 and 2*d'1 (where d'1 is as defined above). In the case of a single treatment block, this distance separates this treatment block and the downstream wall facing the containment cover.

Advantageously part of the treatment gas is recirculated, from the injection member 21 towards the upstream side of the unit. All or some of the treatment gas thus recirculated is then admitted into a recirculation volume, delimited according to the invention by the end edge of the upstream front wall of the cover, by the pressing roll, by the support and by the upstream end of the treatment unit. Positioning this end edge as close as possible to the pressing roll facilitates the driving of the ambient air, by means of the treatment gas present in this recirculation volume. In other words, any significant entry of ambient air in this recirculation volume and consequently in the direction of the treatment zone is prevented.

Various possibilities of implementation of the facility according to the invention will now be explained hereinafter.

In general terms, first and second gases are directed towards the travelling substrate, by means of the first and second injection means described above. The first gas, also referred to as the treatment gas, comprises at least one plasma-forming gas such as nitrogen, argon or helium. In the present embodiment, this treatment gas consists essentially of the aforementioned plasma-forming gas. In this embodiment, the second gas, also referred to as the auxiliary gas, comprises other gases or vaporized compounds of a type known per se, referred to as dopants.

Advantageously, the width of the injection slot 21, namely the dimension thereof along XX, is calculated according to a flow of plasma-forming gas admitted at the inlet. This width is sized so that the speed of the gas discharge is between 1 m/s and 20 m/s. Preferably, this speed of the gas is similar to the speed of travel of the substrate. Typically, for a flow rate of 50 m³/h of plasma-forming gas and a length (along XX) of slot of 20 centimeters, the width is 1.5 millimeters.

By way of variant embodiments, provision may be made for the treatment gas to comprise, apart from the plasma-forming gas, other compounds such as the dopants described above. Provision can also be made for the auxiliary gas to comprise, apart from the dopants, a proportion of plasma-forming gas, or another component such as a spray or a mist.

The plasma-forming gas injected through the conduits 21 flows first of all downstream, between the bottom wall 16 and the substrate SUB. Moreover, dopants are directed towards the substrate, via the second injection member 31. The position of the injection conduits 21, 31, in particular the mutual angle of inclination thereof, makes it possible to concentrate the dopants in the vicinity of the substrate through a pressing effect. This effect is particularly advantageous since it makes it possible to maximize the treatment speed. In the case of a deposition, it also makes it possible to reduce the unwanted formation of powder on the electrode. This makes it possible to remedy, to a significant extent, the drawbacks of WO-A-2016/128259 presented above.

It should be noted that, in the embodiment in FIGS. 1 to 4, this pressing effect is provided whereas the injection means for the first and second gases comprise an intermediate homogenization chamber. However, this pressing effect can be found with injection means different from those of FIGS. 1 to 4, in particular injection means with no intermediate chamber.

Figure 5:
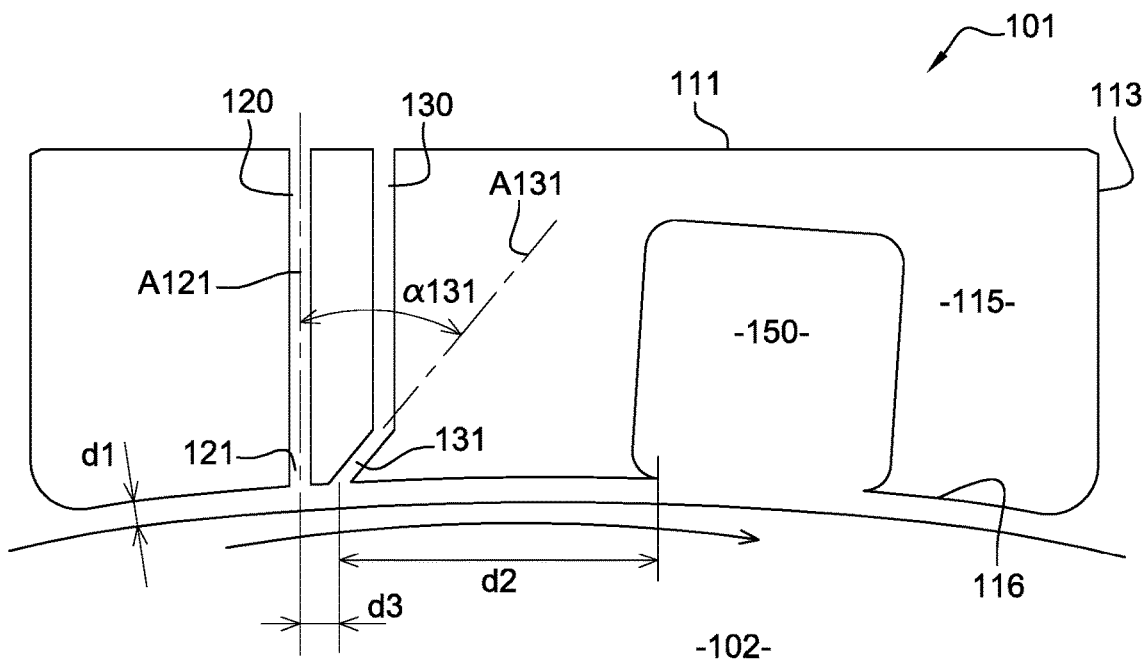
FIG. 5 is a front view similar to FIG. 2 illustrating a treatment unit according to a variant embodiment of the invention.

In this regard the first injection means may comprise a plurality of conduits, distributed regularly along the axis YY. FIG. 5 illustrates one of these conduits, extending between the top and bottom walls of the block, the upstream part of which forms the inlet member 120 and the downstream part the injection member 121. In addition the second injection means also comprise a plurality of conduits, regularly distributed along the axis YY. FIG. 5 illustrates one of these conduits, extending between the top and bottom walls of the block, the upstream part of which forms the inlet member 130 and the downstream part the injection member 131. The upstream part 130 is parallel to the conduit 120 whereas the downstream part 131 is inclined so as to form with the conduit 120 an angle α131, the value of which is similar to that of α31 described above.

The fact that the conduit 131, intended for injecting the second gas, is inclined in the direction of the conduit 120, intended for the injection of the first gas, also confers the above pressing effect. By way of additional variants, not shown, provision may be made for the injection means to comprise an intermediate chamber with a shape different from that illustrated in the figures, in particular a simplified shape as known from the prior art.

In the variant embodiment shown in FIGS. 1 to 5, the facility according to the invention comprises a plurality of units 1A to 1D disposed one behind the other in the direction of travel of the substrate. According to an advantageous feature, treatment gases and/or auxiliary gases different from one unit to another may be injected. This makes it possible to implement different processing operations in a single pass.

Figure 6:
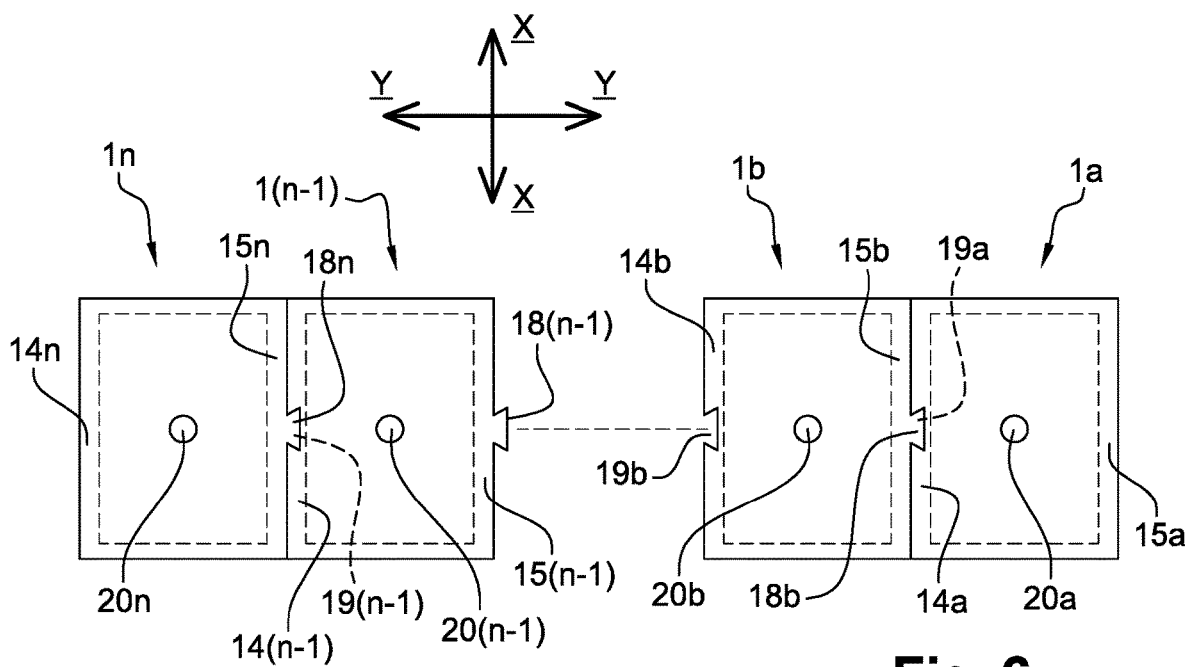
FIG. 6 is a plan view illustrating schematically a succession of treatment units disposed alongside each other, in the direction of travel of the substrate.

FIG. 6 illustrates an additional variant embodiment of the invention in which the facility according to the invention comprises a plurality of units 1a to 1n, disposed alongside each other with reference to the travel direction, namely along the axis YY. These elementary processing units may be placed alongside each other in their common housing, without any specific fixing means. Provision may also be made, as illustrated in FIG. 6, for adjacent units to be equipped with mutual fixing means, in particular of the removable type. In this FIG. 6 there is a fixing by means of tenons 18b to 18n, equipping a first unit, which cooperate with complementary mortises 19a to 19(n−1), equipping the adjacent unit.

The embodiment in FIG. 6 has specific advantages. This is because it allows the treatment of very wide substrates while using small individual treatment units. Provision may be made for placing a number of units side by side, which may vary from 2 up to n, where n is for example around 10. Thus, in the case where 10 units the dimension of which along YY is 20 to 30 centimeters are disposed side by side, there is a total treatment dimension of 2 to 3 meters along YY. It should be noted that, in this FIG. 6, the units are not necessarily shown to actual scale, for reasons of clarity. In reality, these units may in fact have greater dimensions along the axis YY.

Providing units of small size along the axis YY allows simpler manufacture as well as more convenient use. Moreover, the reduced size of the units ensures satisfactory distribution of the gases along YY, compared with a larger unit. Finally, this embodiment is advantageous in terms of flexibility. In practice, a large number of identical individual units are produced, which are assembled in the required number according to each width to be treated.

EXAMPLES

The invention is illustrated below by an example which does not however limit the scope thereof. This example relates to a type of plasma treatment and to the measurement of the surface energy after treatment.

A facility such as the one described in FIGS. 1 to 4 is used. This facility comprises a drum with a diameter of 400 mm and seven identical treatment blocks, like the treatment block 1A. Each of these blocks has first injection orifices 21 with a total surface area of 400 mm², and second injection orifices 31 with a total surface area of 100 mm². The characteristic dimension (d1) is equal to 1 millimeter.

A film of BOPP with a width of 550 mm and a thickness of 20 μm (micrometers) is conveyed. $N_2$ is used as the plasma-forming gas or first gas and $C_2H_2$ as the reactive gas or second gas.

The surface energy obtained is measured after treatment with test inks calibrated in accordance with ASTM D-2578. Before treatment, the film has a surface energy of 30 mN/m.

In a first embodiment according to the invention, the plasma-forming gas is injected at respective rates of 50 m³/h and the reactive gas at 5 l/h. This configuration resulted in a surface energy of 58 mN/m at 600 m/min.

Next, for comparison, a second implementation not in accordance with the invention was carried out. For this purpose, the facility differs in three respects from the one presented above:

the angle α31 is 135°;
the chambers 22 and 32 have been replaced by cylindrical cavities with a diameter of 5 mm;
the distance d20 is equal to 0 mm.

The other constituent elements of the facility, and the gas flows, are identical to those of the first embodiment above.

In this case, the maximum speed that results in a surface energy of 58 mN/m is 200 m/min.

The best distribution of the gases, and the pressing of the reactive gases against the treatment surface, therefore resulted in an increase in the treatment speed by a factor of 3 for the same high treatment quality.

We claim:

1. A treatment unit for a surface treatment facility of a substrate in motion, the surface treatment facility including a support for the substrate, the support defining a counter-electrode, the treatment unit comprising:

a block having a top wall, a pair of parallel peripheral walls, a pair of parallel lateral walls, and a bottom wall defining a housing for receiving at least one electrode to cooperate with the counter-electrode to create an electrical discharge; and first injection means for injecting at least one first plasma-forming gas as a treatment gas towards the support, the first injection means including:

a first admission passage, extending through the block in communication with a treatment gas source, for admission of the treatment gas, the first admission passage having a principal axis defining a first direction of flow of the treatment gas that is substantially perpendicular to a direction of travel of the substrate, an intermediate chamber, arranged in the block in communication with the first admission passage, to receive the treatment gas, and a first injection slot extending through the block for communication with the intermediate chamber and injecting the treatment gas towards the support, wherein the intermediate chamber includes:

an upstream region for treatment gas flow, said upstream region extending from the first admission passage for flow of the treatment gas in a second direction that is perpendicular with respect to the first direction of flow of the treatment gas through the first admission passage, the longitudinal cross-section of the upstream region increasing from the inlet to the outlet along the transverse axis, and the transverse cross-section increasing from the inlet to the outlet along a longitudinal axis that is in a direction of substrate travel, and a downstream region for treatment gas flow, said downstream region extending from the upstream region for flow of the treatment gas in a third direction that is perpendicular with respect to the second direction, a cross-section of said downstream region increasing from an inlet of the downstream region towards an outlet of the downstream region in a direction towards the first injection slot, said downstream region increasing in cross-section along the transverse axis and decreasing in cross-section along the longitudinal axis in a direction of gas flow.

2. The treatment unit of claim 1, wherein:

the intermediate chamber is symmetrical with respect to a median axis of the treatment unit, the upstream region is formed by a first upstream conduit and a second upstream conduit respectively extending on either side of the median axis, the downstream region is formed by a first downstream conduit that extends from the first upstream conduit and a second downstream conduit that extends from the second upstream conduit, and the first downstream conduit and the second downstream conduit respectively extending on either side of the median axis and each extending a respective upstream conduit.

3. The treatment unit of claim 2, wherein:

the intermediate chamber is formed around a central core having a triangular shape with an upstream face that is exposed to the first admission passage, and lateral faces extending from the upstream face.

4. The treatment unit of claim 2, wherein the first injection slot extends over substantially an entire width of the treatment unit.

5. The treatment unit of claim 2, further comprising a second injection means for injecting at least one second plasma-forming gas as an auxiliary treatment gas towards the support.

6. The treatment unit of claim 5, wherein the second injection means comprises:

a second admission passage extending through the block in communication with an auxiliary treatment gas source, for admission of the auxiliary treatment gas, a second intermediate chamber arranged in the block in communication with the second admission passage, to receive the auxiliary treatment gas, and a second injection slot extending through the block in communication with the second intermediate chamber, for injecting the auxiliary treatment gas in an inclined direction towards the first injection slot.

7. The treatment unit of claim 1, wherein a distance between the parallel peripheral walls is between 50 mm and 200 mm.

8. The treatment unit of claim 1, wherein a distance between the parallel lateral walls is between 1000 mm and 2000 mm.

9. The treatment unit of claim 1, wherein a distance between the bottom wall and the support is less than 5 millimeters.

10. A surface treatment facility of a substrate in motion, the surface treatment facility comprising:

a support for the substrate, the support defining a counter-electrode;

a treatment gas source; and a treatment unit that includes a block having a top wall, a pair of parallel peripheral walls, a pair of parallel lateral walls, and a bottom wall defining a housing for receiving at least one electrode to cooperate with the counter-electrode to create an electrical discharge, and first injection means for injecting at least one first plasma-forming gas as a treatment gas towards the support, the first injection means including:

a first admission passage, extending through the block in communication with the treatment gas source, for admission of the treatment gas, the first admission passage having a principal axis defining a first direction of flow of the treatment gas that is substantially perpendicular to a direction of travel of the substrate, an intermediate chamber, arranged in the block in communication with the first admission passage, to receive the treatment gas, and a first injection slot extending through the block for communication with the intermediate chamber and injecting the treatment gas towards the support, wherein the intermediate chamber includes:

an upstream region for treatment gas flow, said upstream region extending from the first admission passage for flow of the treatment gas in a second direction that is perpendicular with respect to the first direction of flow of the treatment gas through the first admission passage, the longitudinal cross-section of the upstream region increasing from the inlet to the outlet along the transverse axis, and the transverse cross-section increasing from the inlet to the outlet along a longitudinal axis that is in a direction of substrate travel, and a downstream region for treatment gas flow, said downstream region extending from the upstream region for flow of the treatment gas in a third direction that is perpendicular with respect to the second direction, a cross-section of said downstream region increasing in cross-section from an inlet of the downstream region towards an outlet of the downstream region in a direction towards the first injection slot.

11. The surface treatment facility of claim 10, wherein:

the intermediate chamber is symmetrical with respect to a median axis of the treatment unit, the upstream region is formed by a first upstream conduit and a second upstream conduit respectively extending on either side of the median axis, the downstream region is formed by a first downstream conduit that extends from the first upstream conduit and a second downstream conduit that extends from the second upstream conduit, and the first downstream conduit and the second downstream conduit respectively extending on either side of the median axis and each extending a respective upstream conduit.

12. The surface treatment facility of claim 11, further comprising:

an auxiliary treatment gas source; and a second injection means for injecting at least one second plasma-forming gas as an auxiliary treatment gas towards the support.

13. The surface treatment facility of claim 12, wherein the second injection means comprises:

a second admission passage extending through the block in communication with the auxiliary treatment gas source, for admission of the auxiliary treatment gas, a second intermediate chamber arranged in the block in communication with the second admission passage, to receive the auxiliary treatment gas, and a second injection slot extending through the block in communication with the second intermediate chamber, for injecting the auxiliary treatment gas in an inclined direction towards the first injection slot.

14. A method for surface treatment of a substrate using the surface treatment facility of claim 10, the method comprising:

moving the substrate;

injecting the treatment gas in a first direction towards the substrate; and injecting the auxiliary treatment gas in a second direction towards the substrate.

* * * * *